356-153.

SR 06-06-72 OR 3,667,848

June 6, 1972 J. O. PERCIVAL 3,667,848

SEMICONDUCTOR CHIP BONDING METHOD

Filed Feb. 2, 1970 2 Sheets-Sheet 1

INVENTOR
JOHN O. PERCIVAL

BY Louis A. Kline
John J. Callahan
John P. Lariano

HIS ATTORNEYS

June 6, 1972 J. O. PERCIVAL 3,667,848

SEMICONDUCTOR CHIP BONDING METHOD

Filed Feb. 2, 1970 2 Sheets-Sheet 2

INVENTOR
JOHN O. PERCIVAL

BY

HIS ATTORNEYS

United States Patent Office 3,667,848
Patented June 6, 1972

3,667,848
SEMICONDUCTOR CHIP BONDING METHOD

John O. Percival, Dayton, Ohio, assignor to The National Cash Register Company, Dayton, Ohio Filed Feb. 2, 1970, Ser. No. 7,648
Int. Cl. G01b *11/26*
U.S. Cl. 356—153 1 Claim

ABSTRACT OF THE DISCLOSURE

The present invention relates to a method and apparatus for aligning and bonding a semiconductor flip chip to a semiconductor flip chip substrate. An alignment device which has an approximately right-angle set of mirrors is inserted between the solder balls of the semiconductor flip chip and the bonding pads of the semiconductor flip chip substrate, so as to align the solder balls of the semiconductor flip chip in relation to the bonding pads of the semiconductor flip chip substrate. Optical means is provided within the alignment device so as to present the super-positioning of the images of the solder balls of the semiconductor flip chip in relation to the bonding pads of the semiconductor flip chip substrate. After the solder balls of the semiconductor flip chip have been aligned in relation to the bonding pads of the semiconductor flip chip substrate, the alignment device is removed from therebetween. Subsequently, the solder balls of the semiconductor flip chip may be pressed against the bonding pads of the semiconductor flip chip substrate.

BACKGROUND OF THE INVENTION

U.S. Pat. No. 2,247,113, which issued June 24, 1941, on the application of Frank Benford, discloses an alignment device for aligning a punch of a punch press above a die of the punch press. Benford places a right-angle external reflector between the punch and the die, so as to reflect light from both the punch and the die into an eye piece. The two reflected beams are presented adjacent one another within the eye piece of Benford's device, so as to position the punch precisely above the die.

The method of the present invention shows a new use for an alignment device. The method of the present invention is used in fabricating integrated circuit units in a fast, accurate manner. The method of the present invention aids in putting a semiconductor flip chip on a semiconductor flip chip substrate in an accurately-aligned position.

The apparatus of the present invention is different from the alignment device of Benford. The apparatus of the present invention will superimpose the image of a semiconductor flip chip with the image of a semiconductor flip chip substrate, by optical means. The alignment device of Benford does not superimpose the image of a punch with the image of a die. Benford's alignment device presents the image of a punch adjacent the image of a die.

A semiconductor flip chip is a chip of semiconductor material in which transistors, diodes and other components have been integrated. The semiconductor flip chip is too small and atmosphere-sensitive to connect up as in an electronic system. It must be placed on a substrate for interconnection and packaging. The semiconductor flip chip may be bonded to the substrate in several ways, as by bonding gold wires between the bonding pads of the semiconductor flip chip and the bonding pads of the semiconductor flip chip substrate.

Another way of binding the semiconductor flip chip to the semiconductor flip chip substrate is to put solder balls on the semiconductor flip chip and on the semiconductor flip chip substrate. The small semiconductor flip chip is placed with its solder balls down onto the solder balls of the semiconductor flip chip substrate. The solder balls of the semiconductor flip chip are melted and coalesced to the solder balls of the semiconductor flip chip. The semiconductor flip chip is thus bonded to the substrate for protective packaging.

SUMMARY OF THE INVENTION

An object of the present invention is to provide a method of aligning semiconductor flip chips above semiconductor flip chip substrates so that the semiconductor flip chip is precisely bonded to the semiconductor flip chip substrate.

Another object of the present invention is to provide an alignment device for superimposing flip chip rays with flip chip substrate rays and for presenting the superimposed rays to the eye of an observer.

The present invention relates to a method of aligning a semiconductor flip chip above a semiconductor flip chip substrate so that the semiconductor flip chip may be precisely joined to the semiconductor flip chip substrate, comprising positioning a light source adjacent said semiconductor flip chip and said semiconductor flip chip substrate, reflecting light from said semiconductor flip chip and said semiconductor flip chip substrate, focusing the reflected light from said semiconductor flip chip through a viewing means to form an image of said semiconductor flip chip from a viewing means, and focusing the reflected light from said semiconductor flip chip substrate also onto said viewing means to form an image of said semiconductor flip chip substrate from said viewing means, the image of said semiconductor flip chip being in register with the image of said semiconductor flip chip substrate from said viewing means, when said semiconductor flip chip is properly aligned over said semiconductor flip chip substrate.

DESCRIPTION OF THE PREFERRED EMBODIMENT

Figure 1:
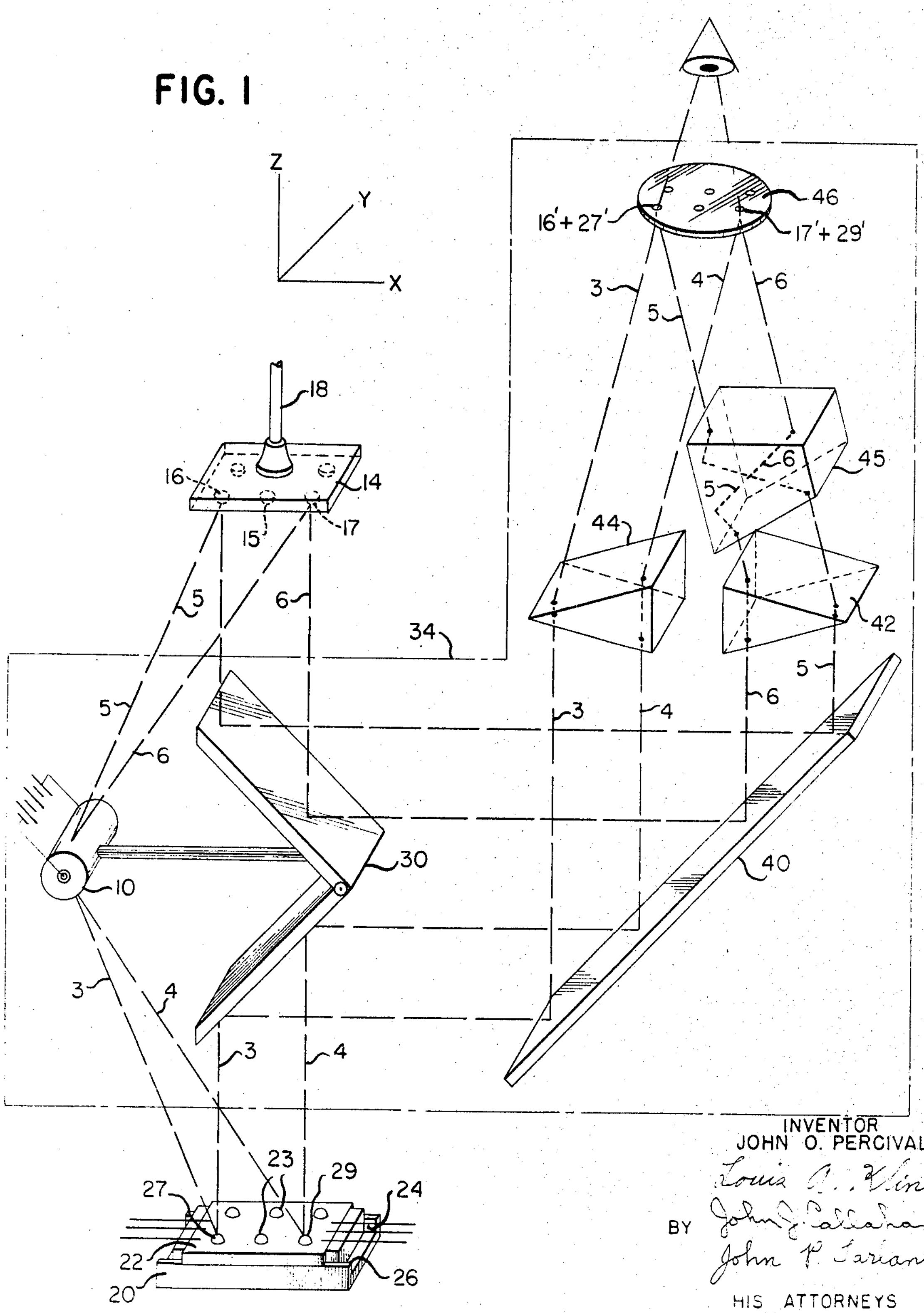
FIG. 1 is a perspective view of the alignment device having an etched glass viewing plate therein.

A flip chip 14, such as a semiconductor flip chip, is shown in FIG. 1. Solder balls 16 and 17 are deposited on the semiconductor flip chip 14. The semiconductor flip chip 14 is suspended by a three-dimensionally adjustable rod 18. A platform 20 lies below the semiconductor flip chip 14. A semiconductor flip chip substrate 22, having bonding pads 27 and 29, is held upon the platform 20 by means of side walls 24 and 26.

In FIG. 1, an approximately right-angle set of mirrors 30 of an alignment device 34 is inserted midway between the semiconductor flip chip 14 and the semiconductor flip chip substrate 22. The alignment device 34, which is transparent to light rays 3, 4, 5, and 6, holds the mirrors 30. The axis of the right-angle set of mirrors 30 is at 45 degrees to the reflecting surface of a reflecting mirror 40. The reflecting mirror 40 reflects light from the mirrors 30 into prisms 42 and 44.

A ray 3, from a bulb 10, is reflected from a bonding pad 27, off of the lower mirror of the set of right-angle mirrors 30. The ray 3 travels off of a second mirror 40 into the prism 44 and through an etched glass viewing plate 46 to the eye of an observer. The light ray 5 is reflected from the solder ball 16 of the semiconductor flip chip 14, off of the upper mirror of the set of right-angle mirrors 30, off of the second mirror 40, through the prism 42, through a dove prism 45, and through the etched glass viewing plate 46 into the eye of an observer.

By making the light ray 5 in registry with the light ray 3 on the etched glass plate 46, the solder ball 16 is placed precisely above the bonding pad 27 of the semiconductor flip chip substrate 22.

The rays 5 and 6 may be placed in registry with the rays 3 and 4 by moving the suspension rod 18 within the X–Y plane. When the light rays 5 and 6 are coincident with the rays 3 and 4 on the etched glass plate 46, the solder balls 16 and 17 are directly above the bonding pads 27 and 29 of the semiconductor flip chip substrate 22. By means of a minus Z direction movement of the suspension rod 18, the solder balls 16 and 17 may be brought precisely into contact with the bonding pads 27 and 29, respectively.

The prism 42 bends the rays 6 and 5 toward the etched glass viewing plate 46. The dove prism 45 inverts the order of the rays 6 and 5 to 5 and 6. The prism 44 bends the rays 3 and 4 toward the etched glass viewing plate 46. The rays 3 and 4 may thus be superimposed with the rays 5 and 6 on the etched glass plate 46 by means of the prisms 42, 44, and 45.

The etched glass viewing plate 46 presents an image of the surface of the semiconductor flip chip substrate 22 and also an image of the semiconductor flip chip 14. A person may view the ground glass viewing plate 46 from many different directions. When the image of the semiconductor flip chip 14 on the etched glass viewing plate 46 coincides with the image of the semiconductor flip chip substrate 22 on the etched glass viewing plate 46, the semiconductor flip chip 14 is aligned with the semiconductor flip chip substrate 22.

Figure 2:
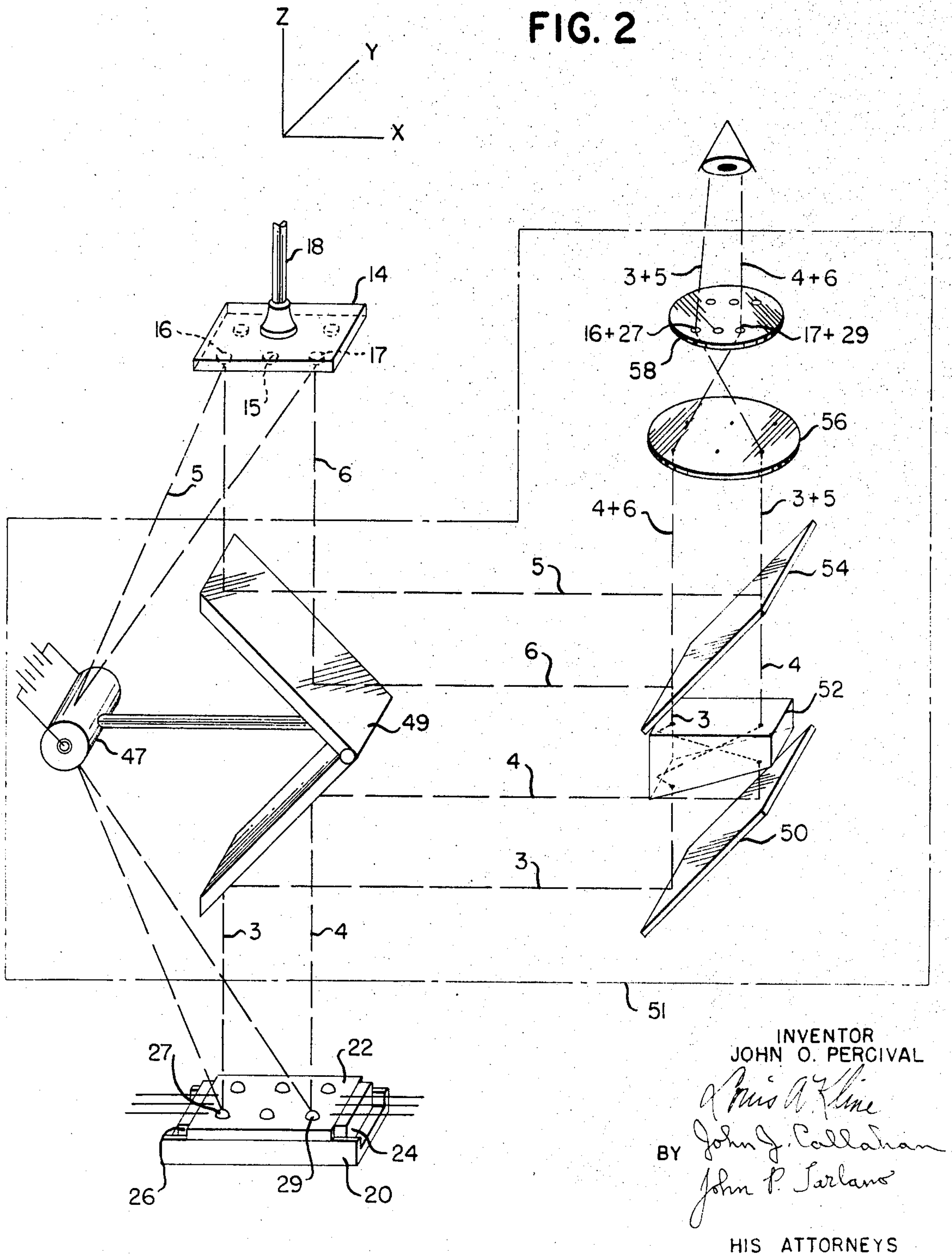
FIG. 2 is a perspective view of the alignment device having a viewing lens therein.

As shown in FIG. 2, an approximately right-angle set of mirrors 49 of an alignment device 51 is inserted midway between the semiconductor flip chip 14 and the semiconductor flip chip substrate 22. The alignment device 51, which is transparent to the light rays 3, 4, 5, and 6, holds the mirrors 49. The axis of the right-angle set of mirrors 49 is at 45 degrees to the reflecting surface of a reflecting mirror 50 and of a beam-splitting plate 54. The reflecting mirror 50 reflects the rays 3 and 4 through a dove prism 52, where they are inverted, and through the beam-splitting plate 54 to a lens 56. The beam-splitting plate 54 reflects the rays 5 and 6 to the lens 56.

The ray 3, from a bulb 47, is reflected from the bonding pad 27, off of the lower mirror of the set of right-angle mirrors 49. The ray 3 travels off of the mirror 50, into the dove prism 52, through the beam-splitting plate 54, and through the lenses 56 and 58 to the eye of an observer. The light ray 5 is reflected from the solder ball 16 of the semiconductor flip chip 14, off of the upper mirror of the set of right-angle mirrors 49, off the beam-splitting plate 54, and through the lenses 56 and 58 into the eye of an observer. By making the light ray 5 in registry with the light ray 3 from the lens 58, the solder ball 16 is placed precisely above the bonding pad 27 of the semiconductor flip chip substrate 22.

The rays 5 and 6 may be placed in registry with the rays 3 and 4 by moving the suspension rod 18 within the X-Y plane. When the light rays 5 and 6 are coincident with the rays 3 and 4 from the lens 58, the solder balls 16 and 17 are directly above the bonding pads 27 and 29 of the semiconductor flip chip substrate 22. By means of a minus Z direction movement of the suspension rod 18, the solder balls 16 and 17 may be brought precisely into contact with the bonding pads 27 and 29, respectively.

What is claimed is:

1. A simplified method for bonding solder balls of a light reflective semiconductor chip to bonding pads of a light reflective opaque semiconductor chip substrate, comprising:

(a) positioning said semiconductor chip above said opaque semiconductor chip substrate with a surface of said semiconductor chip having said solder balls deposited thereon located adjacent to said bonding pads;

(b) positioning a viewing means between said semiconductor chip and said opaque semiconductor chip substrate;

(c) focusing reflected light emitted from a light source from said semiconductor chip to said viewing means to form an image of said semiconductor in said viewing means;

(d) simultaneously focusing reflected light emitted from said light source from said opaque semiconductor chip substrate to said viewing means to form an image of said opaque semiconductor chip substrate, in said viewing means;

(e) bringing the image of the solder balls of said semiconductor chip in register with the image of the bonding pads of said opaque semiconductor chip substrate in said viewing means, by moving said chip parallel to the surface of said opaque semiconductor chip substrate;

(f) removing said viewing means from between said semiconductor chip and said opaque semiconductor chip substrate;

(g) bringing said chip together with said opaque semiconductor chip substrate; and (h) heating said semiconductor chip and said opaque semiconductor chip substrate for a short period of time to melt and coalesce the solder balls of said semiconductor chip to the bonding pads of said opaque semiconductor chip substrate.

References Cited

UNITED STATES PATENTS

| | | | |
|---|---|---|---|
| 2,344,296 | 3/1944 | Frink | 356—171 X |
| 2,841,049 | 7/1958 | Scott | 350—286 X |
| 3,036,493 | 5/1962 | Mottu et al. | 356—164 |
| 3,290,986 | 12/1966 | Woehl | 356—138 |
| 3,357,091 | 12/1967 | Reissmueller | 29—203 P X |

FOREIGN PATENTS

| | | | |
|---|---|---|---|
| 12,141 | 8/1956 | Germany | 356—150 |
| 1,025,745 | 4/1966 | Great Britain | 356—150 |

WILLIAM L. SIKES, Primary Examiner

UNITED STATES PATENT OFFICE
CERTIFICATE OF CORRECTION

Patent No. 3,667,848 Dated June 6, 1972

Inventor(s) John O. Percival

It is certified that error appears in the above-identified patent and that said Letters Patent are hereby corrected as shown below:

Claim 1,

Column 4, line 23, insert -- chip -- after "semiconductor"

Signed and sealed this 17th day of October 1972.

(SEAL)
Attest:

EDWARD M.FLETCHER,JR.
Attesting Officer

ROBERT GOTTSCHALK
Commissioner of Patents